(12) United States Patent
Park et al.

(10) Patent No.: US 12,175,012 B2
(45) Date of Patent: Dec. 24, 2024

(54) LOW POWER EFFICIENCY RF FACIAL MOVEMENT DETECTION SCHEME

(71) Applicant: MICROSOFT TECHNOLOGY LICENSING, LLC, Redmond, WA (US)

(72) Inventors: Chang Joon Park, Sunnyvale, CA (US); Martin Francis Galinski, III, Santa Clara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 567 days.

(21) Appl. No.: 17/548,441

(22) Filed: Dec. 10, 2021

(65) Prior Publication Data

US 2023/0104809 A1 Apr. 6, 2023

Related U.S. Application Data

(60) Provisional application No. 63/252,595, filed on Oct. 5, 2021.

(51) Int. Cl.
| | | |
|---|---|---|
| G06F 3/01 | (2006.01) | |
| G01D 5/20 | (2006.01) | |
| H03H 7/01 | (2006.01) | |
| H03K 17/687 | (2006.01) | |

(52) U.S. Cl.
CPC .............. G06F 3/012 (2013.01); G01D 5/20 (2013.01); H03H 7/0115 (2013.01); H03K 17/6871 (2013.01)

(58) Field of Classification Search
CPC ........ G06F 3/012; G01D 5/20; H03H 7/0115; H03K 17/6871
See application file for complete search history.

(56) References Cited

U.S. PATENT DOCUMENTS

| 3,503,007 A | 3/1970 | Kutschbach |
| 10,564,717 B1 | 2/2020 | Shahmohammadi et al. |

(Continued)

OTHER PUBLICATIONS

"International Search Report and Written Opinion Issued in PCT Application No. PCT/US22/041286", Mailed Date: Nov. 30, 2022, 13 Pages.

(Continued)

*Primary Examiner* — Minh Q Phan
(74) *Attorney, Agent, or Firm* — Scott Y. Shigeta; Newport IP, LLC

(57) ABSTRACT

The techniques disclosed herein provide low power, efficient systems, devices and circuits that detect facial movements of a user of a Mixed Reality (MR) device. An example battery operated system includes a pulse driver that generates pulse signals at a set frequency, while operated below the battery voltage. An LC filter receives the pulse signals and generates a transient response based on a capacitance value associated with an antenna. The capacitance of the antenna varies responsive to facial movements of the user based on the varying distance of the antenna to the users skin. A coupling capacitor AC couples the output of the LC filter to other system components, where the AC coupled output of the LC filter includes a detected signal amplitude and a detected signal phase of the LC filter responsive to facial movements of the user.

20 Claims, 9 Drawing Sheets

(56) References Cited

U.S. PATENT DOCUMENTS

| | | | |
|---|---|---|---|
| 11,675,421 B1* | 6/2023 | Park | .................. G06V 40/16 |
| | | | 345/156 |
| 2009/0219039 A1 | 9/2009 | Fasshauer | |
| 2014/0104184 A1 | 4/2014 | Meador | |
| 2014/0379351 A1 | 12/2014 | Raniwala | |
| 2016/0018846 A1 | 1/2016 | Zenoff | |
| 2019/0361519 A1 | 11/2019 | Lee | |
| 2020/0085084 A1 | 3/2020 | Piel et al. | |
| 2023/0205309 A1 | 6/2023 | Park | |
| 2023/0236309 A1* | 7/2023 | Park | .................. G06F 3/012 |
| | | | 342/22 |

OTHER PUBLICATIONS

Notice of Allowance mailed on Jun. 17, 2024, in U.S. Appl. No. 17/585,462, 15 pages.
"International Search Report and Written Opinion Issued in PCT Application No. PCT/US22/048311", Mailed Date: Feb. 10, 2023, 10 Pages.

\* cited by examiner

LOW POWER EFFICIENCY RF FACIAL MOVEMENT DETECTION SCHEME

CROSS REFERENCE TO RELATED APPLICATION

This patent application claims the benefit of U.S. Provisional Patent Application Ser. No. 63/252,595 filed Oct. 5, 2021, entitled "Low Power Efficiency RF Facial Movement Detection Scheme," which is hereby incorporated in its entirety by reference.

BACKGROUND

Mixed Reality (MR), like Augmented Reality (AR) and Virtual Reality (VR), is an industry with a rapidly expanding footprint. An MR device may be implemented with a headset that includes video and audio components to provide the immersive MR experience. Sensors, such as gyroscopic sensors, may be located on or within the headset to sense physical movement of the user. Additional sensors may be located about the headset to track eye gaze of the user, sense audible commands from the user, and to sense other aspects of the user.

Various face tracking schemes that may be employed to sense small movements of the user's skin, which can be processed to identify facial expression and other indicia that may be used to enhance the immersive MR experience. In one example scheme, a headset may be equipped with circuits that include a number of sense antennas that are positioned about various locations of the headset. The antennas signals may feed into an LC resonance circuit, which is driven to a resonance by an LC driver. The output of the LC resonance circuit may feed into a sense amplifier to provide suitable signals for an Analog-to-Digital Converter (ADC), which can convert the sensed signals into the digital domain for further processing. Capacitance of the LC resonance circuit varies depending on the distance between the sense antennas on the headset and the facial skin of the user. The distance between the skin and the antennas varies may also vary with the facial expression of the user due to movement of the skin from facial muscles. Thus, the total capacitance of the LC resonance circuit, and thus the characteristic transient response and Q of the LC resonance circuit, will vary based on the user's facial movements and the resulting varied distance between the antennas and the user's skin.

The present disclosure contemplates that a conventional implementation of an LC resonant drive circuit may require relatively high power-supply levels. This is in part due to the overall design of a conventional system, where the amplitude of the sensed signal from the LC resonance circuit should be as large as possible to maximize the resolution of the analog to digital conversion process by the ADC.

The presently disclosed techniques propose a low power solution for a MR wearable device to achieve sufficient resolution without requiring high voltages for the power-supply, and without sacrificing signal quality. Power is conserved such that the battery life of the MR device may be extended, while system performance is enhanced. The disclosure made herein is presented with respect to these and other technical challenges.

SUMMARY

The techniques disclosed herein are directed to devices, circuits, systems and methods for facial movement detection with low-power efficiency and reduced power supply requirements by employing a novel architectural scheme.

In various examples, the techniques disclosed herein provide low power, efficient systems, devices, and circuits that detect facial movements of a user of a Mixed Reality (MR) device. An example battery operated system includes a pulse driver that generates pulse signals at a set frequency, while operated below the battery voltage. An LC filter receives the pulse signals and generates a transient response based on a capacitance value associated with an antenna. The capacitance of the antenna varies responsive to facial movements of the user based on the varying distance of the antenna to the user's skin. A coupling capacitor AC couples the output of the LC filter to other system components, where the AC coupled output of the LC filter includes a detected signal amplitude and a detected signal phase of the LC filter responsive to facial movements of the user.

The described embodiments may be implemented as devices, circuits, and systems, which may include software. This Summary is provided to introduce a selection of concepts in a simplified form that are further described below This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The Detailed Description is described with reference to the accompanying figures. References made to individual items of a plurality of items can use a reference number with a letter of a sequence of letters to refer to each individual item. Generic references to the items may use the specific reference number without the sequence of letters.

DETAILED DESCRIPTION

Figure 1:
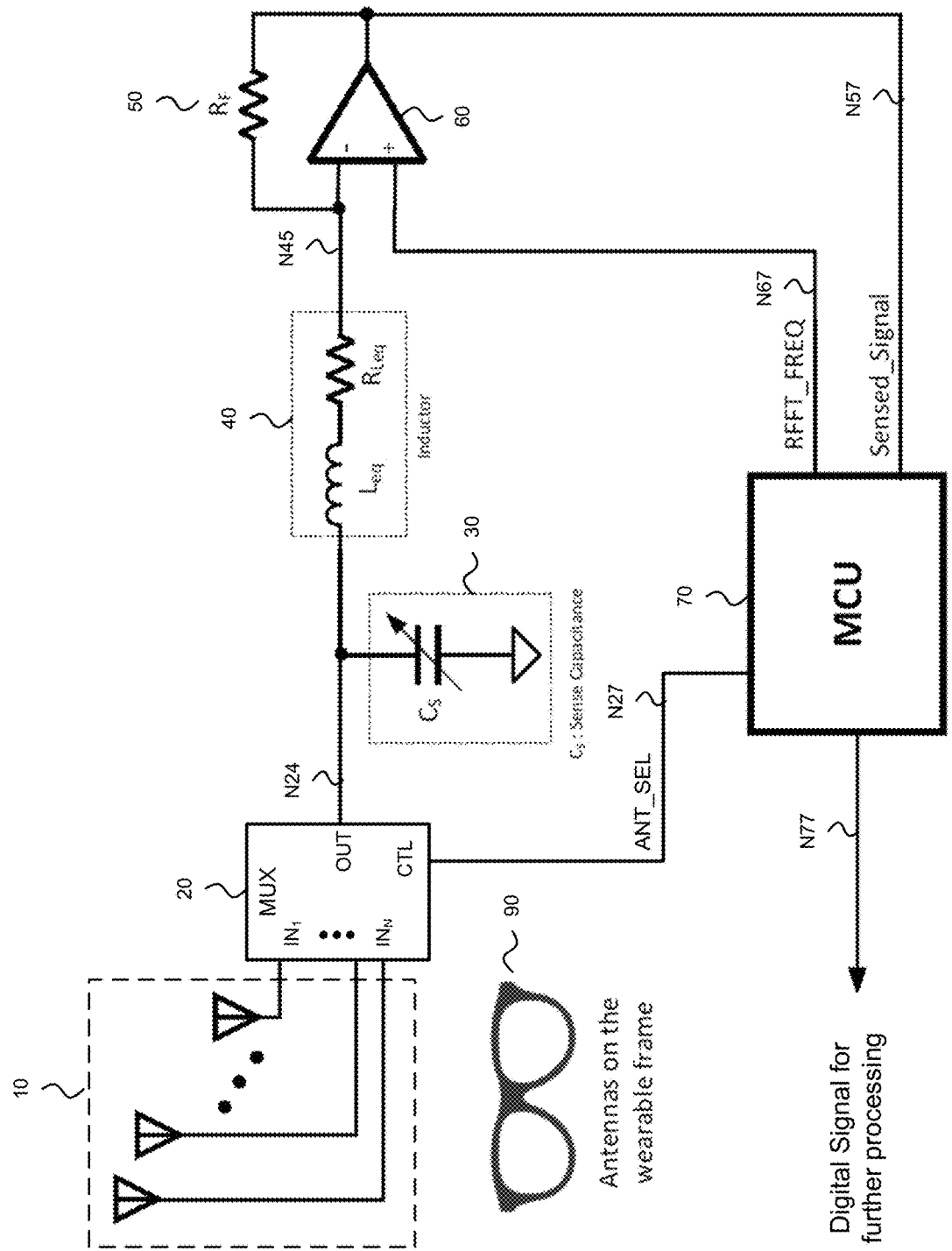
FIG. 1 shows an illustrative schematic of an RF facial movement detection system.

In the following detailed description, reference is made to the accompanied drawings, which form a part hereof, and which is shown by way of illustration, specific example configurations of which the concepts can be practiced. These configurations are described in sufficient detail to enable those skilled in the art to practice the techniques disclosed herein, and it is to be understood that other configurations can be utilized, and other changes may be made, without departing from the spirit or scope of the presented concepts. The following detailed description is, therefore, not to be taken in a limiting sense, and the scope of the presented concepts is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means a direct electrical connection between the items connected, or an indirect connection through one or more passive or active intermediary devices and/or components. The terms "circuit" and "component" means either a single component or a multiplicity of components, either active and/or passive, that are coupled to provide a desired function. The term "signal" means at least a power, current, voltage, or data signal. Based upon context, the term "coupled" may refer to a wave or field coupling effect, which may relate to a corresponding magnetic field, electrical field, or a combined electromagnetic field.

The proposed technologies describe a low power efficient RF facial movement detection scheme, that is suitable for use in portable systems that operate on battery power. A DC-AC converter can be utilized to convert the DC power provided by the battery to AC Power. The DC-AC converter may be configured to generate the AC power having a peak voltage that corresponds to at an intermediate level being between the DC voltage of the battery (e.g., $V_{BAT}$), and the peak AC voltage (e.g., $V_{PEAK}$) generated by the pulse driver in the system. The proposed systems also include an LC filter (or resonator) with a high quality factor (or Q), where the LC filter uses a series inductor circuit in conjunction with a sense capacitor that is formed by a sense antenna and facial skin from the user. The LC filter is configured to amplify the AC voltage of the AC power at a resonant frequency of the RF face tracking system.

An important aspect of the proposed scheme is that the face tracking system benefits from improved power efficiency. The power inverter design can be integrated in an ASIC with the processing circuit units, which operates on battery power and does not require high voltage power supplies. In terms of the area and power efficiency, there should be huge benefits as will be described herein. The input amplitude of DC-AC converter can be adjusted with the target AC signal amplitude from the system.

The resonance frequency of the LC filter will change with variations in the sense capacitor from the antenna, which changes responsive to facial movement relative to the location of the antenna. For a given fixed input frequency, the gain and phase of the output signals from the LC filter will change with sensed capacitance variations. Very large output signals (e.g., in a range of about 20 Vp-p to about 50 Vp-p) can be achieved with a relatively small input signals (e.g., in a range of about 1 Vp-p to about 5 Vp-p) due to the peak gain and high Q at the resonant frequency of the LC filter.

Given the large output signals that may be achieved from the LC filter as described above, the requirements for other components of the system may be relaxed. For example, a high bandwidth operational amplifier is a system component that is often used as a sense amplifier for the output of a filter circuit. Such high bandwidth operational amplifiers would be required to operate with power supply voltages in the range of about 20V to about 50V to match the required output levels needed for high resolution. Additionally, the operational amplifier would consume standby current on the order of milli-amperes even when no signal is present, consuming valuable power in a battery powered portable device. However, in the presently disclosed systems, such high bandwidth operational amplifiers may be eliminated, reducing circuit complexity, reducing power supply requirements, and reducing power consumption. Additional system components (e.g., the ADC, MCU, processor, etc.) may achieve further benefits from the reduced circuit complexity, reduced power supply requirements, and reduced power consumption.

FIG. 1 shows an illustrative schematic of an RF facial movement detection system 100. As illustrated, system 100 includes antennas 10, a multiplexer (MUX) 20, a sense capacitor 30, an inductor circuit 40, a feedback resistor 50, an operational amplifier 60, and a microcontroller unit (MCU) 70. The antennas 10 may be positioned about various locations of a wearable MR headset, such as a wearable frame 90.

Multiplexer (MUX) 20 includes a set of input ports ($IN_1$ to $IN_N$), an output port (OUT), and a control port (CTL). Each of the input ports ($IN_1$ to $IN_N$) is connected to a corresponding one of the antennas 10. The output port (OUT) of MUX 20 is coupled to node N24. The control port (CTL) of MUX 20 will selectively couple one of the input ports to the output port, based on an antenna selection signal (e.g., ANT_SEL) from node N27, which is provided by the MCU 70.

The sense capacitor 30 is illustrated as a capacitor with a variable capacitance value ($C_S$) that is coupled between node N24 and a ground terminal (e.g., GND). Although shown as a physical capacitor component, sense capacitor 30 corresponds to the characteristic capacitance of the currently selected antenna from the MUX 20. Since the antennas are physically located on a wearable frame 90, the actual capacitance value ($C_S$) of the antenna will vary based on proximity to the skin of the user. The inductor circuit 40 includes an inductor (Leq) that is coupled in series between node N24 and node N45, with a characteristic resistance of the inductor represented as a series connected resistor (Req). Since node N24 corresponds to the output of MUX 20, the currently selected one of the antennas 10 is effectively coupled to the inductor circuit 40. From node N45 looking through the inductor circuit 40 towards the sense capacitance, an LC filter circuit may be identified.

A feedback resistor 50 is connected between node N45 and node N57, and has a value given as $R_F$. Operational amplifier 60 includes an inverting input (−) which is connected to node N45, a non-inverting input (+) that is connected to node N67, and an output that is connected to node N57. Thus, the feedback resistor 50 is arranged in the feedback loop between the output and inverting input (−) of the operational amplifier 60.

The microcontroller unit (MCU) 70 has an input at node N57, and provides outputs at nodes N27, N67, and N77. The MCU can be configured via software or firmware instructions to control the operation of the circuit 100 according to a time-division multiplexing scheme. First, one of the antennas 10 is selectively coupled to node N24 by MCU 70, responsive to the antenna select signal (ANT_SEL) at node N27. Second, the operational amplifier is driven by an alternating signal (e.g., RFFT_FREQ) such as a sine wave that may be provide by the MCU 70 at node N67. While the alternating signal is presented to the non-inverting input (+) of operational amplifier 60, the operational amplifier will drive its output until the non-inverting input (+) and the inverting input (+) are equalized. Thus, the alternating signal will be effectively driven into the LC filter at Node N45 by the operational amplifier 60.

Based on the high Q resonance characteristics of the LC filter, the output of the operational amplifier 60 at node N57 will correspond to a sense signal (e.g., SENSED_SIGNAL), which is provided to the MCU 70. MCU 70 captures the sensed signal from node N57 (e.g., via an Analog-to-Digital Converter, or ADC) which is then provided as a digital signal at node N77 and to other systems for further processing (e.g., processing to determine facial expression, movement, etc.).

The sensed signal may have a significantly high peak to peak voltage due to the high Q nature of the LC filter. Thus, the operational amplifier 60 must have enough headroom (e.g., high power supply voltages can be required) to handle the output signals of the LC filter. Additionally, the transient response of the operational amplifier must be significantly fast enough to stabilize the output within all the timing requirements, which equates to a high gain-bandwidth product and a significant standby current on the order of milliamperes. All in all, the operational amplifier 60 has very specific technical requirements which leads to an increased cost (both the cost of the component itself, as well as the power/bandwidth system implementation costs) to achieve satisfactory performance. The present disclosure evaluated these and other possible implementations and has identified the shortcomings to identify a new approach as will be described below.

Figure 2:
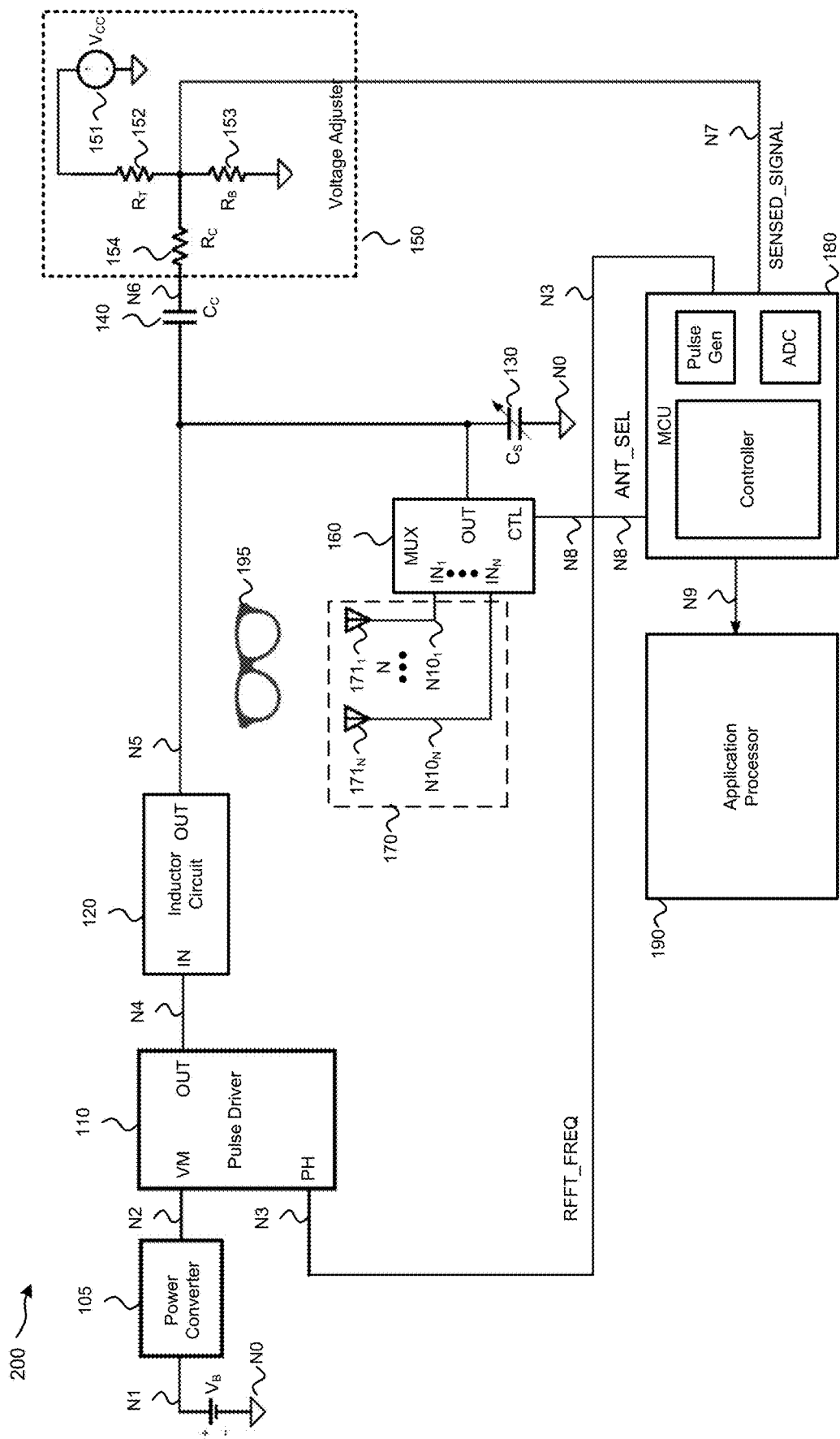
FIG. 2 shows an illustrative schematic of a low power efficient RF facial movement detection system.

FIG. 2 shows an illustrative schematic of a low power efficient RF facial movement detection system 200. As illustrated, system 200 includes a power converter 105, a pulse driver 110, an inductor circuit 120, a sense capacitor 130, a coupling capacitor 140, a voltage adjuster 150, a multiplexer (MUX) 160, antennas 170, a microcontroller unit (MCU) 180, and an application processor 190. The antennas 170 may be positioned about various locations of a wearable MR headset, such as a wearable frame 195.

The power converter 105 has an input port that is coupled to node N1, which corresponds to a battery supply voltage ($V_B$), and an output port at node N2. The pulse driver 110 includes a first input port (VM) which is coupled to node N2, a second input port (PH) which is coupled to node N3, and an output port (OUT) that is coupled to node N4. The inductor circuit 120 includes a first port (IN) that is coupled to node N4, and a second port (OUT) that is coupled to node N5. The sense capacitor 130 is coupled between node N5 and node N0. The coupling capacitor 140 is coupled between node N5 and node N6. The voltage adjuster 150 includes a first port that is coupled to node N6 and a second port that is coupled to node N7. The MUX 160 includes input ports $IN_1$ to $IN_N$, each coupled to a respective one of nodes $N10_1$ to $N10_N$, an output port (OUT) that is coupled to node N5, and a control port (CTL) that is coupled to node N8. The MCU 180 includes a first output port that is coupled to node N3, an input port that is coupled to node N7, a second output port that is coupled to node N8, and a third output port that is coupled to node N9.

The power converter 105 is configured to convert the voltage from node N1 to another appropriate voltage at node N2, which provides the supply voltage to the pulse driver 110. In various examples, the supply voltage used by the pulse driver 110 at node N2 will be lower than the battery voltage (VB) from node N1. For example, in a simple implementation, the power converter 105 can simply be implemented as a voltage divider that generates a voltage at node N2 as fraction of the original battery supply voltage at node N1. In another example, the power converter 105 can be implemented similar to a digital-to-analog converter (DAC), with a resistor divider circuit that includes multiple tap points for various voltages that are selected from a digital control signal from the MCU (not shown).

The pulse driver 110 is configured to generate one or more pulse signals that are used by an LC filter in a DC-AC converter topology. The maximum magnitude of the pulse signals is determined by the voltage (VM) at node N2, and the frequency of the pulse signals is determined by a periodic signal (e.g., a clock or pulse signal, RFFT_FREQ) from the MCU at node N3. For example, a series of pulses from the pulse driver 110 are received by the LC filter, which is excited by the pulses and resonates at a characteristic resonant frequency. Example pulse driver topologies will be further described with reference to FIGS. 3-5.

Multiplexer (MUX) 160 is configured to selectively couple one of the input ports ($IN_1$ to $IN_N$) to the output port (OUT), based on an antenna selection signal (e.g., ANT_SEL) from node N8, which is provided by the MCU 180. The sense capacitor 130 is illustrated as a capacitor with a variable capacitance value ($C_S$) that is coupled between node N5 and node N0 (e.g., GND or VSS). Although shown as a physical capacitor component, the sense capacitor 130 corresponds to the characteristic capacitance of the currently selected antenna from the MUX 160.

Since the antennas 170 are physically located on a wearable frame 190, the actual capacitance value ($C_S$) of the antenna will vary based on proximity to the skin of the user. The inductor circuit 120 has a characteristic inductance value (Leq) that is coupled in series between node N4 and node N5. Since node N4 corresponds to the output of MUX 160, the currently selected one of the antennas 170 is effectively coupled to the inductor circuit 120. From node N4 looking through the inductor circuit 120 towards the sense capacitor 130, an LC filter circuit may be identified. Thus, the sense capacitor 130 and the inductor circuit 140 together form the LC filter that is used by the pulse driver 110 in the DC-AC converter topology.

In some examples, the sense capacitors from the antennas 170 will have values in a range of about 150 pF to about 250 pF, with nominal values on the order of about 200 pF. In other examples, the inductor circuits 120 may have an effective inductance value in a range of about 1400 uH to about 3000 uH, with nominal values on the order of about 2200 uH.

Coupling capacitor 140 is an AC coupling capacitor that provides DC isolation between the LC filter and the voltage adjuster 150. In some examples, the value of the coupling capacitor 140 will be in a range of about 0.1 nF to about 1 nF, with nominal values on the order of about 0.5 nF, so as to not significantly impact the LC filter response. The AC response to the pulses driven into the LC filter will result in a hi Q resonance response that has a significant high voltage (e.g., about 10 Vp-p to about 50 Vp-p), without the use of any additional amplifiers.

The voltage adjuster 150 is configured to adjust the DC level of the AC coupled output signal from the LC filter at node N6 (via coupling capacitor 140), and also apply a scaling factor to the signal. The objective of the voltage adjuster is to maximize the conversion efficiency and resolution of an analog-to-digital converter (ADC) in the MCU 180.

In some examples as illustrated, the voltage adjuster 150 may include a voltage source 151, resistors 152, 153 and 154. Voltage source 151 provides a DC supply voltage, VCC or a high-side DC supply voltage, to the series combination of resistors 152 and 153. Resistor 152 is coupled between the output of the voltage source 151 (e.g., a high-side DC supply voltage at a DC supply node) and node N7. Resistor 153 is coupled between the node N7 and a node N0 (VSS, VGND, which may be a ground or a low-side DC supply voltage). Resistor 152 corresponds to the top resistor, RT, while resistor 153 corresponds to the bottom resistor RB. When RT=RB, the DC voltage at node N7 will be VCC/2. Example resistance values for resistors 152 and 153 are in a range of about 10K ohms to about 30K ohms, and nominally about 20K ohms. Resistor 154 is series coupled between node N6 and N7 and operates as part of the voltage scaler for the AC component of the signal from node N6, which can reduce the signal amplitude to match the headroom of the ADC located in the MCU 180. Example resistance values for resistor 154 are in a range from about 50K ohms to about 150K ohms, with nominal values of about 100K ohms.

The proposed system illustrated in FIG. 2 employs a DC-AC converter topology that converts the DC power provided by the battery to AC power. The DC-AC converter may generate the AC power having a peak voltage that is at an intermediate level between the DC voltage of the battery, and the peak AC voltage generated by the system. The system includes a Q-controlled filter that uses a series inductance circuit as described above. In various examples, the inductance circuit can be implemented as a conventional inductor, a pair of inductively (or magnetically) coupled mutual inductors, or as a cross-coupled pair of mutual inductors.

Examples pulse drivers with different arrangements of LC filters will now be described with reference to FIGS. 3-5. Like components are labelled the same as in FIG. 2, and the same discussions apply to these example implementations.

Figure 3:
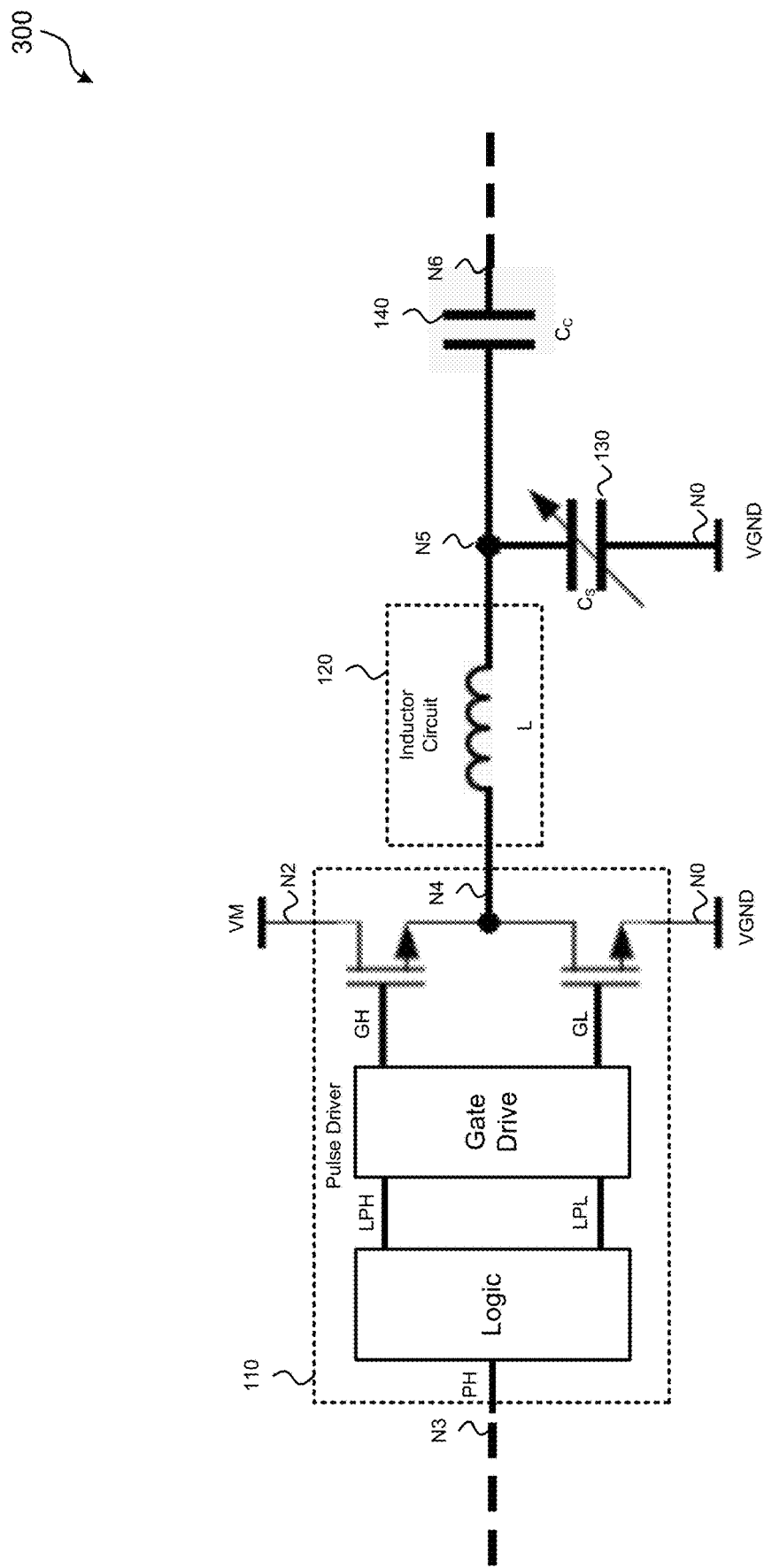
FIG. 3 shows an illustrative schematic of a first example pulse driver and LC resonance circuit for an example low power efficiency RF facial movement detection system.

FIG. 3 shows an illustrative schematic of a first example pulse driver and LC resonance circuit for an example low power efficiency RF facial movement detection system 300. As illustrated, the pulse driver 110 is implemented as a half-bridge driver with a pair of FETS, a logic block, and a gate drive block. The inductor circuit 120 is illustrated as a simple inductor, and the sense capacitor 130 and the coupling capacitor 140 are illustrated as in FIG. 2.

A first of the FETS includes a gate that is selectively activated by a first gate drive signal, GH, a drain that is coupled to the high-side supply at node N2 (e.g., VM), and a source that is coupled to node N4. When activated by the first gate drive signal GH, the first FET effectively couples power from node N2 to node N4 resulting in the LC circuit charging to the high-side supply voltage (VM). A second of the FETS includes a gate that is selectively activated by a second gate drive, GL, a drain that is coupled to node N4, and a source that is coupled to the low-side supply at node N0 (e.g., VGND). When activated by the second gate drive signal GL, the second FET effectively couples node N4 to node N0, reversing the direction of conduction as the LC circuit is discharged to the low-side supply (e.g., VGND, VSS, etc.) at node N0.

The logic block is configured to receive the input frequency signal from the MCU at node N3, while generating high and low side switch control signals LPH and LPL. The gate drive block is configured to provide the first and second gate drive signals GH and GL, responsive the switch control signals LPH and LPL, with sufficient speed so that the first FET and the second FET are not active at the same time, preventing significant switching or shoot-through currents.

Figure 4:
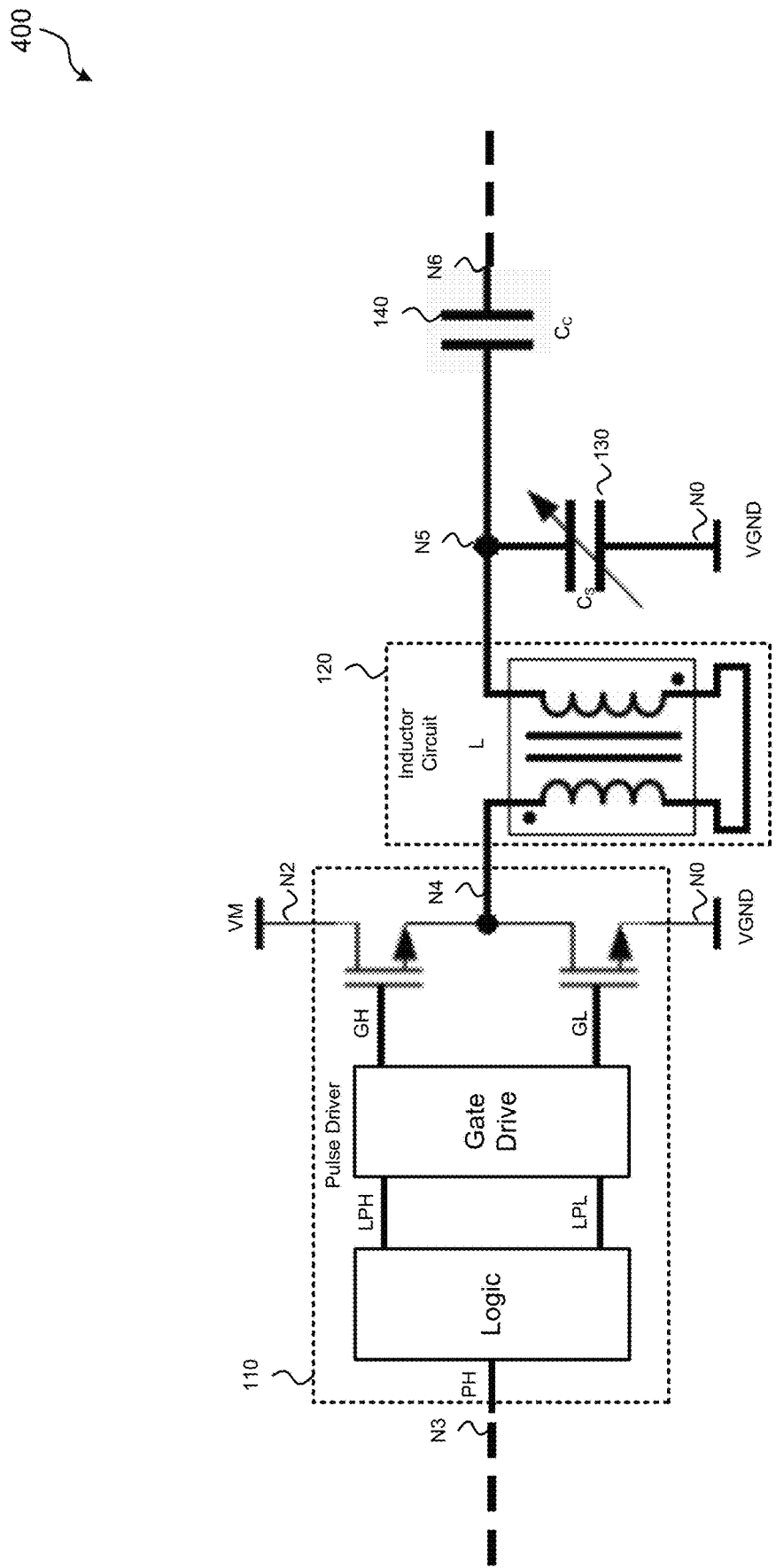
FIG. 4 shows an illustrative schematic of a second example pulse driver and LC resonance circuit for an example low power efficiency RF facial movement detection system.

FIG. 4 shows an illustrative schematic of a second example pulse driver and LC resonance circuit for an example low power efficiency RF facial movement detection system 400. As illustrated, the pulse driver 110 is again implemented as a half bridge driver with a pair of FETS, a logic block, and a gate drive block. As illustrated, a first inductor (or inductive coil) is coupled between node N4 and a common node with a polarity designated by the dotted end at node N4, and a second inductor (or inductive coil) is coupled between node the common node and node N5, with a polarity designated by the dotted end at the common node. The inductor circuit 120 for system 400 is illustrated as a cross-coupled pair of mutual inductors, where the mutual inductance of the cross-coupled inductors is effective to increase the effective inductance value (Leff) of the inductor circuit 120.

Figure 5:
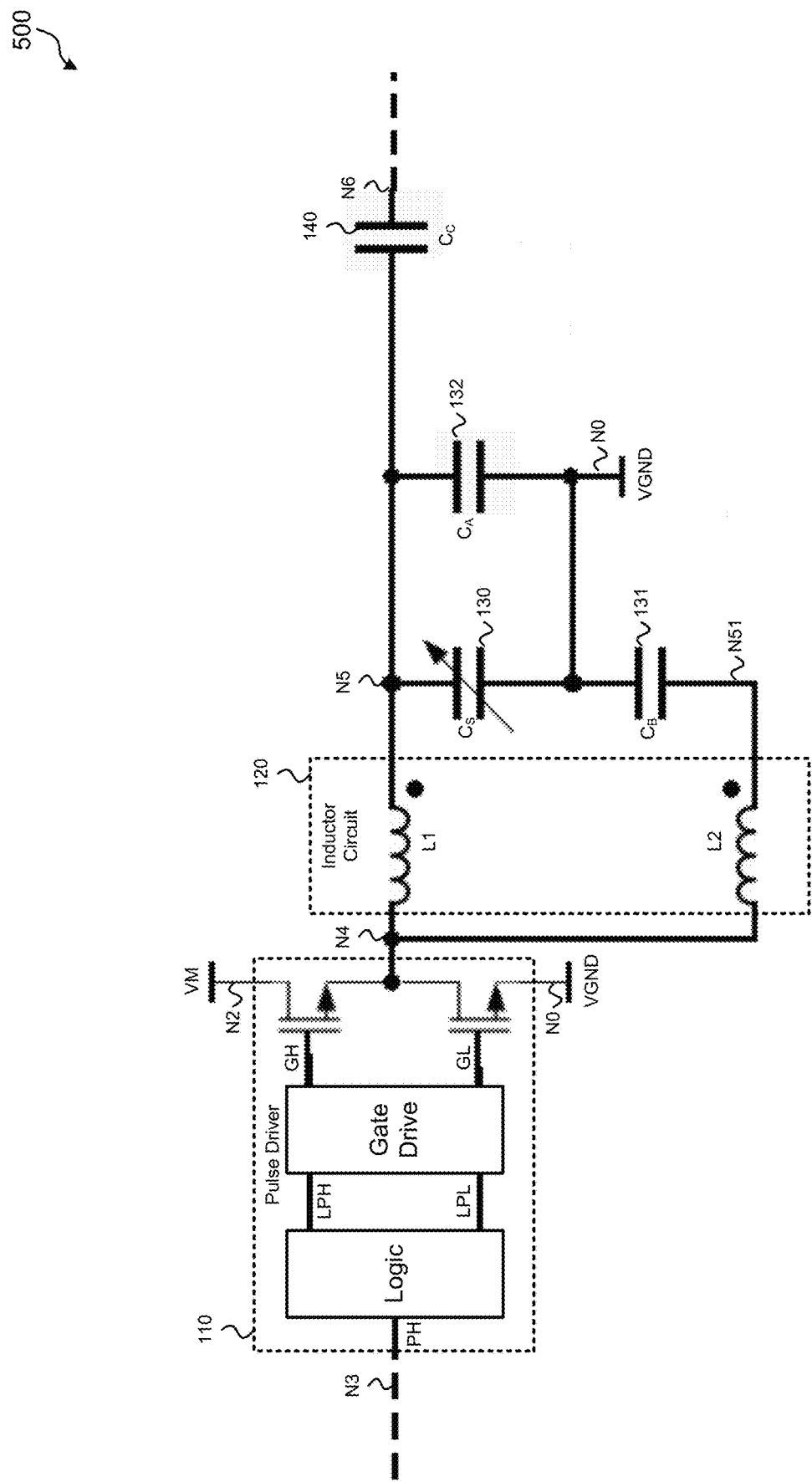
FIG. 5 shows an illustrative schematic of a third example pulse driver and LC resonance circuit for an example low power efficiency RF facial movement detection system.

FIG. 5 shows an illustrative schematic of a third example pulse driver and LC resonance circuit for an example low power efficiency RF facial movement detection system 500. As illustrated, the pulse driver 110 is again implemented as an half bridge driver with a pair of FETS, a logic block, and a gate drive block. The inductor circuit 120 for system 500 is illustrated as a magnetically (or inductively) coupled pair of mutual inductors L1, L2. The sense capacitor 130 and the coupling capacitor 140 are again shown, but with the addition of two more capacitors 131, 132.

A first inductor, L1, is coupled between node N4 to node N5, with a polarity designated by the dotted end at node N5. A second inductor, L2, is coupled between node N4 and node N51 (an intermediate node), with a polarity designated by the dotted end at node N51. Inductors L1 and L2 are magnetically (inductively) coupled, as shown by the polarity dots on the symbols. The sense capacitor 130 is again coupled between node N5 and node N0. However, an additional pair of capacitors 131 and 132 are also shown. Capacitor 131 is coupled between node N51 and node N0, while capacitor 132 is coupled between node N5 and node N0. The arrangement of this circuit facilitates better noise immunity and common mode noise rejection by coupling one conductor of the antenna (e.g., the center conductor) to node N5, and the other conductor of the antenna (e.g., the shield conductor) to node N51. Capacitors 131 and 132 may be, in some examples, substantially the same in value (e.g., about 200 pF), with the variable portion of the capacitance remaining as sense capacitor 130.

The example half bridge drivers illustrated in FIGS. 3-5 are illustrated as including N-type FETS for the first FET and the second FET. However, the specific implementations are not so limited, and other implementations may include P-type FETS, or combinations of N-type and P-type FETS, without departing from the spirit of the present disclosure. Additionally, the logic block and gate drive blocks may be arranged to provide non-overlapping switched operation of N-type FETS, P-type FETS, or any combinations thereof.

Figure 6:
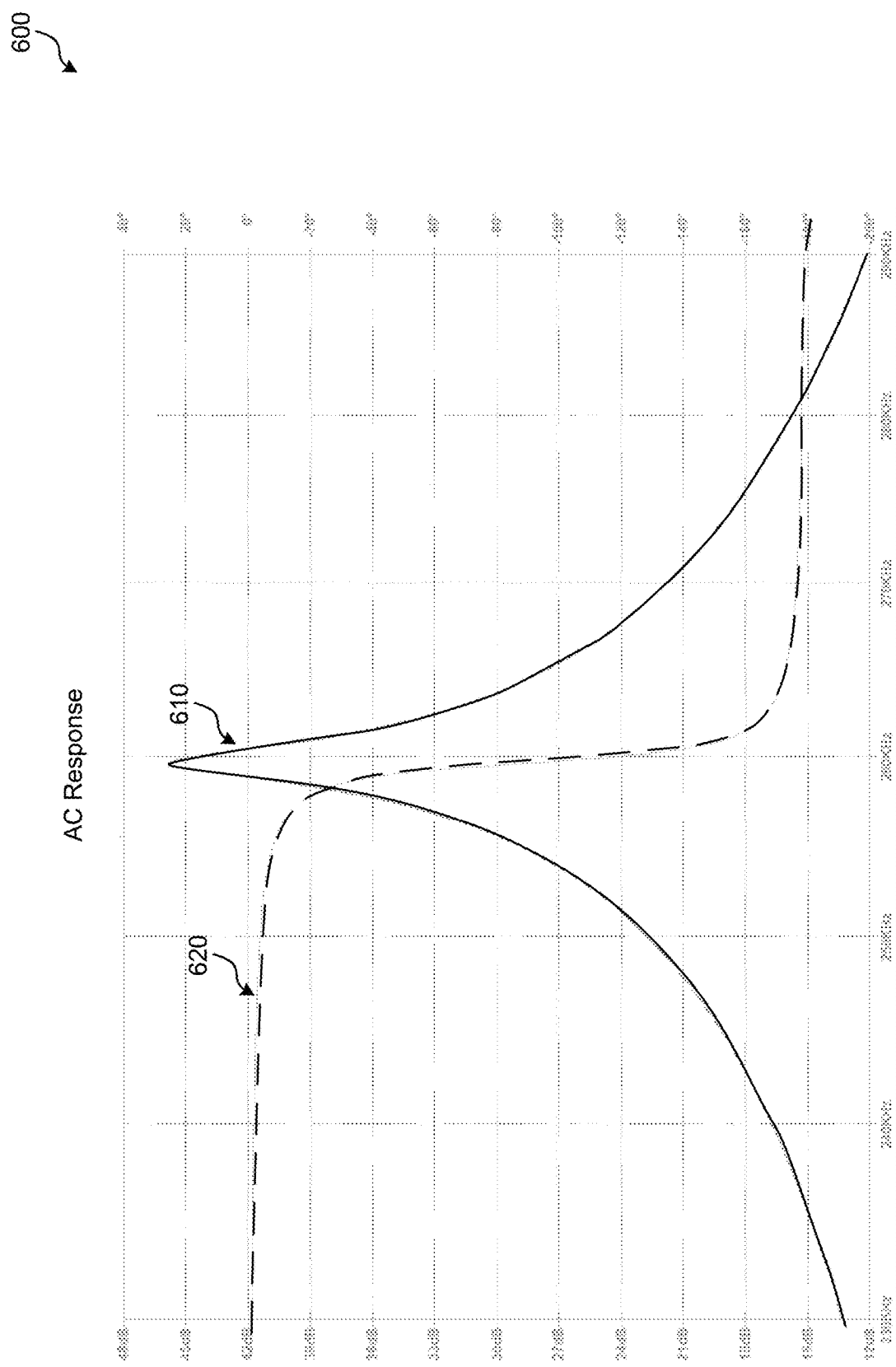
FIG. 6 shows a graph of an AC response for an example low power efficiency RF facial movement detection system.

FIG. 6 shows a graph 600 of an AC response for an example low power efficiency RF facial movement detection system. A high Q filter is results from the capacitance that is formed by the sensor antenna and the facial skin of the user, and the inductor circuit, which results in an amplification of the AC voltage and AC power at the LC resonant frequency of the RF face tracking system. As illustrated, a magnitude 610 of the AC response has a significant peak at around 258 KHZ of around 46 dB of gain. A phase 620 of the AC response is at 0 deg from about 230 KHZ to about 255 KHZ, with a sharp phase shift to −180 deg occurring between 255

KHZ and 265 KHz. The magnitude and phase can be captured by the MCU for each antenna, and then further processed by an application to identify facial movements and facial expressions.

Figure 7:
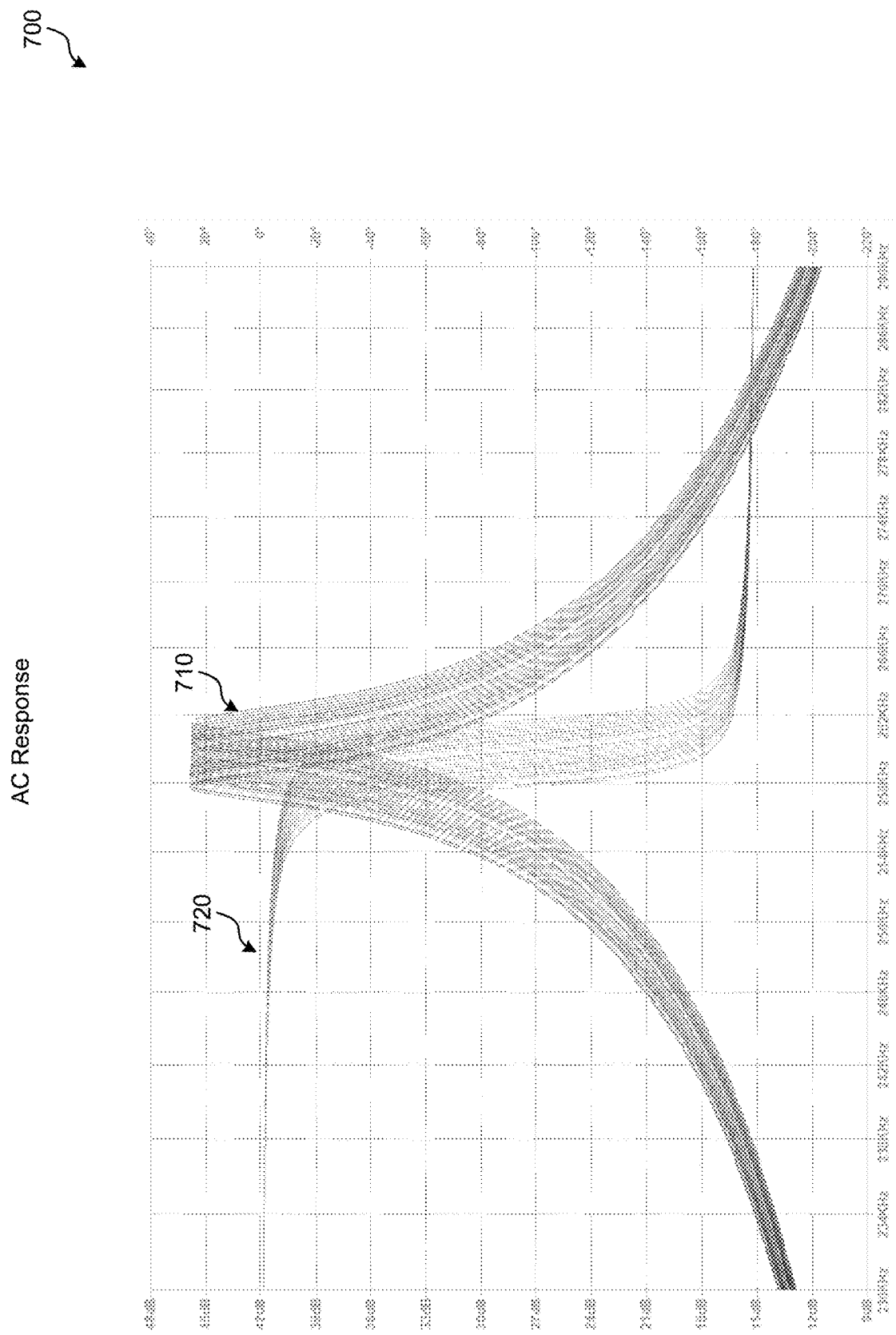
FIG. 7 shows a graph of a collection of AC responses for an example low power efficiency RF facial movement detection system.

FIG. 7 shows a graph 700 of a collection of AC responses for an example low power efficiency RF facial movement detection system. Multiple phase and magnitude responses are overlayed to demonstrate variations in resonant frequency resulting from facial movements. The resonance frequency shifts with sense capacitance variations. Therefore, the gain and phase at the output of the LC filter at a fixed input frequency will be changed with sense capacitance variations. Magnitude of the AC response can thus indicate a change in distance between the antenna and the skin, while phase will give an indication of direction of movement.

Figure 8:
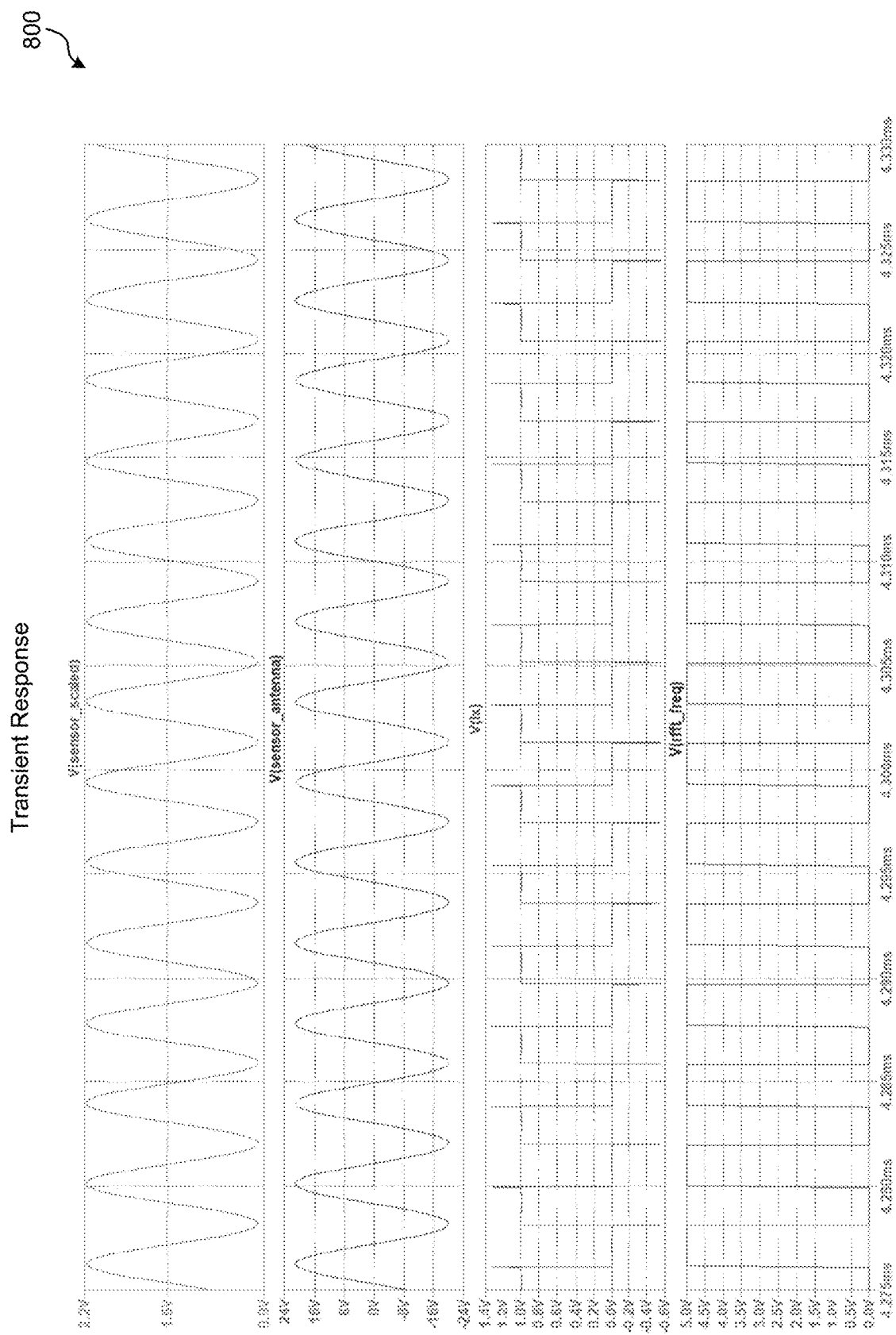
FIG. 8 shows a graph of a transient response for an example low power efficiency RF facial movement detection system.

FIG. 8 shows a graph 800 of a transient response for an example low power efficiency RF facial movement detection system. As illustrated, an input signal V(rfft_freq) is provided by the MCU 180 to the pulse driver 110 (e.g., at node N3) as a 5V clock signal with a frequency of about 259 KHZ. The voltage output by the LC filter (e.g., at node N5), which is directly impacted by the sense capacitance from the antenna, is illustrated as an AC signal, V(sensor_antenna), with an amplitude of about 40V peak-to-peak (+/−20V). The output of the voltage adjuster 150 (e.g., at node N7) yields a scaled AC signal, V(sensor_scaled), which has a DC level of about 1.6V, and a peak-to-peak voltage swing of about 1.2V about the DC level. The output of the pulse driver (e.g., at node N4) is also shown as V(Ix), which shows a voltage swing of about 1V, nominally.

Figure 9:
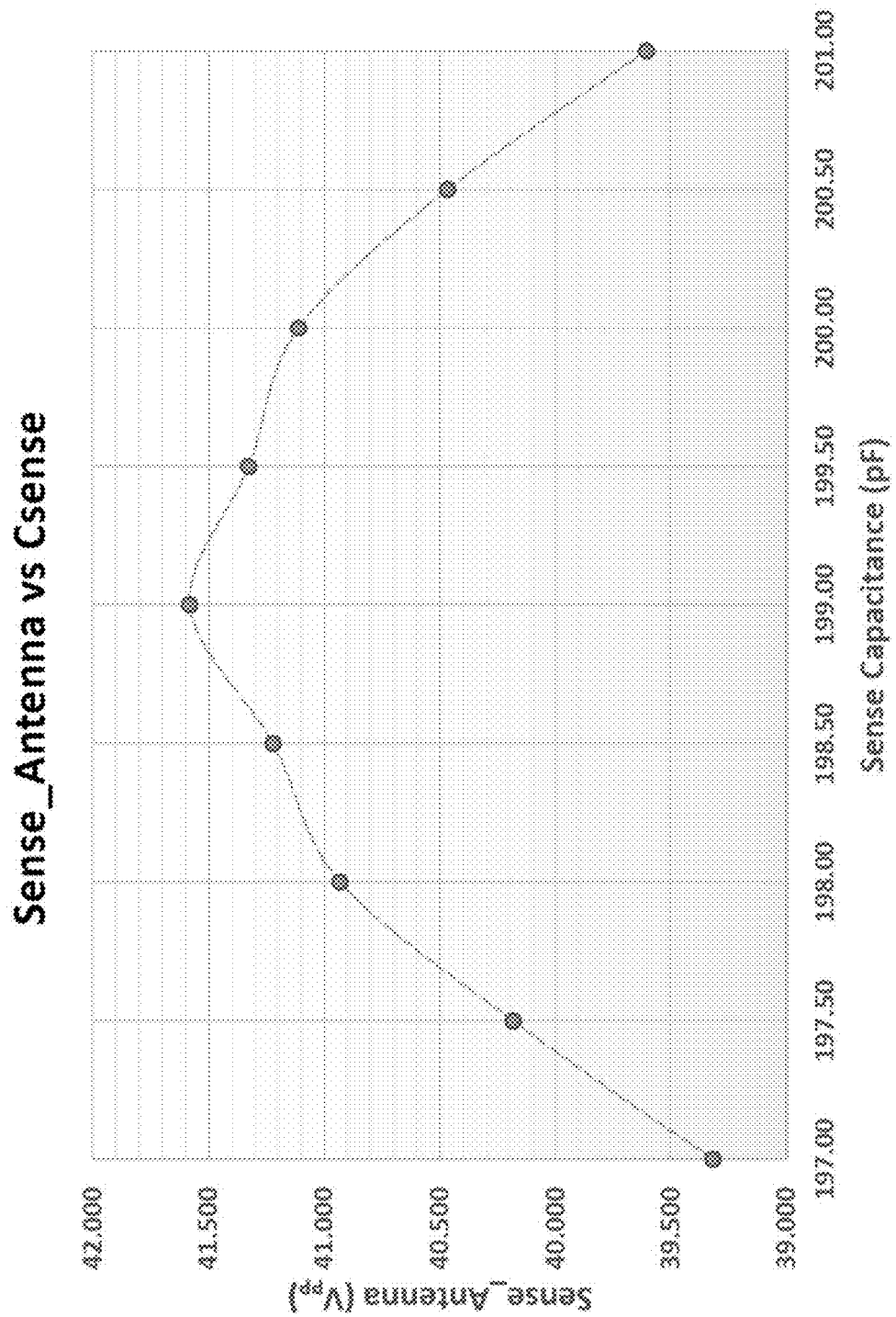
FIG. 9 shows a graph of a capacitance variation for a sense antenna of an example low power efficiency RF facial movement detection system.

FIG. 9 shows a graph 900 of capacitance variations for a sense antenna of an example low power efficiency RF facial movement detection system. As illustrated the amplitude of the sensed signal changes with the value of the sense capacitor 130. For example, a capacitance of 199 pF yields a signal amplitude of about 31.6 Vpp, while a capacitance of 197 pF yields a signal amplitude of about 39.3 Vpp and a capacitance of 201 pF yields a signal amplitude of about 39.36 Vpp. Thus, as facial movement occurs the capacitance values vary based on the change in distances, yielding a different capacitance value.

The most highlighted aspect of the proposed scheme is power efficient benefit. Additionally, since the DC-AC inverter design can operate on battery voltages without high-power supply voltages, the functions can be integrated into an ASIC with the processing circuit units. Manufacturing and assembly costs can be reduced, and beneficially achieve improved power efficiency with a reduced overall footprint on circuit area.

The proposed solution described herein can eliminate high power supply requirements, while also eliminating the need for additional operational amplifiers that requires wide gain-bandwidth products to avoid any signal distortion. Thus, the proposed scheme can achieve a simplified circuit design with simplified power supply requirements, and elimination of costly components. Low power consumption may also be achieved, while also simplifying the design requirements for the Analog-to Digital Converter (ADC), which can also have reduced power requirements. Consequently, battery life may be prolonged and user enjoyment will be enhanced by increased functionality and longer battery life. Signal quality is maintained while the power supply requirements are relaxed, making a robust and reliable solution that eliminates the most power-hungry functional blocks.

The disclosure presented herein also encompasses the subject matter set forth in the following clauses:

Example Clause 1: A battery operated MR device to sense facial movements of a user, the device comprising: a pulse driver (110), an LC filter, and a coupling capacitor (140). The pulse driver (110) generates one or more pulse signals at a first node (N4) responsive to an input frequency signal (RFFT_FREQ), where the pulse driver (110) operates on a reduced voltage that is lower than the battery voltage. The LC filter includes: an inductor circuit (120) and a sense capacitor (130). The inductor circuit (120) is coupled between the first node (N4) and a second node (N5). The sense capacitor (130) is coupled between the second node (N5) and a third node (N0), wherein a capacitance value of the sense capacitor (130) varies responsive to the facial movements of the user such that a characteristic resonance of the LC filter varies responsive to the facial movements. The coupling capacitor (140) is coupled between the second node (N5) and a fourth node (N6), wherein the fourth node (N6) corresponds to an AC coupled output of the LC filter that includes a detected signal amplitude and a detected signal phase of the LC filter responsive to facial movements of the user.

Example Clause 2: The device of Clause 1, further comprising a power converter that is configured to convert the battery voltage to the reduced voltage, wherein the power converter comprises one or more of a voltage divider circuit and a digital-to-analog converter circuit.

Example Clause 3: The device of any of the preceding clauses, further comprising a voltage adjuster that receives the AC coupled output from the fourth node and generates a scaled AC output at a fifth node.

Example Clause 4: The device of clause 3, wherein the voltage adjuster is configured to adjust one or more of: a DC offset for the scaled AC output, and a voltage magnitude adjustment for the scaled AC output.

Example Clause 5: The device of any of the preceding clauses, the inductor circuit further comprising one of an inductor, a magnetically coupled pair of mutual inductors, and a cross-coupled pair of mutual inductors.

Example Clause 6: A battery operated MR device including a wearable frame that is configured to sense facial movements of a user, the device comprising: a power converter (105), a pulse driver (110), an inductor circuit (120), a plurality of antennas (170), a multiplexer (160) and a coupling capacitor (140). The power converter (105) receives the battery voltage from a first node (N1), and generates a reduced voltage at a second node (N2), wherein the reduced voltage is lower than the battery voltage. The pulse driver (110) receives the reduced voltage from the second node (N2), receives an input frequency signal (RFFT_FREQ) from a third node (N3), and generates one or more output pulses at a fourth node (N4), wherein the amplitude of the output pulses are below the reduced voltage, and wherein the frequency of the output pulses are determined by the input frequency signal (RFFT_FREQ). The inductor circuit (120) is coupled between the fourth node (N4) and a fifth node (N5), wherein the inductor circuit (120) has a characteristic inductance (Leq). The plurality of antennas (170) are each positioned about different location of the wearable frame, each of the plurality of antennas (170) having a characteristic sense capacitance ($C_S$) that varies based on distance between the corresponding one of the plurality of antennas (170) and skin of the user. The multiplexer (160) is configured to selectively couple one of the plurality of antennas (170) to a fifth node (N5) response to a control signal (ANT_SEL), wherein an LC filter is formed by the characteristic inductance (Leq) of the inductor circuit (120) and the characteristic sense capacitance ($C_S$) of the selected one of the plurality of antennas (170). The coupling capacitor (140) is coupled between the fifth node (N5) and a sixth node (N6), wherein the sixth node (N6) corresponds to an AC coupled output of an LC filter that includes a detected signal amplitude and a detected signal phase of the LC filter responsive to facial movements of the user.

Example Clause 7: The device of Clause 6, further comprising a voltage adjuster that receives the AC coupled output from the sixth node and generates a scaled AC output at a seventh node.

Example Clause 8: The device of Clause 7, wherein the voltage adjuster is configured to adjust one or more of: a DC offset for the scaled AC output, and a voltage magnitude adjustment for the scaled AC output.

Example Clause 9: The device of any of the preceding clauses, the inductor circuit further comprising one of an inductor, a magnetically coupled pair of mutual inductors, and a cross-coupled pair of mutual inductors.

Example Clause 10: A battery operated MR device including a wearable frame that is configured to sense facial movements of a user, the device comprising: a pulse driver (110), an inductor circuit, a sense capacitor (130), and a coupling capacitor (140). The pulse driver (110) receives the reduced voltage from a second node (N2), receives an input frequency signal (RFFT_FREQ) from a third node (N3), and generates one or more output pulses at a fourth node (N4). The pulse driver (110) includes: a logic block, a gate drive block, a first FET and a second FET. The logic block generates a high side switch control signal (LPH) and a low side switch control signal (LPL) responsive to the input frequency signal (RFFT_FREQ) from the third node (N3). The gate drive block provides a first gate drive signal (GH) responsive to the high-side switch control signal (LPH), a second gate drive signal (GL) responsive to the low-side switch control signal (LPL). The first FET is selectively activated responsive to the first gate drive signal (GH) to couple the second node (N2) to the fourth node (N4). The second FET is selectively activated responsive to the second gate drive signal (GL) to couple the fourth node (N4) to a low-side supply node (N0). The inductor circuit (120) is coupled between the fourth node (N4) and a fifth node (N5), wherein the inductor circuit has a characteristic inductance (Leff). The sense capacitor (130) is coupled between the fifth node (N5) and the low-side supply node (N0), wherein a capacitance value ($C_S$) of the sense capacitor varies responsive to the facial movements of the user such that a characteristic resonance of and LC filter formed by the inductor circuit (120) and the sense capacitor (130) varies responsive to the facial movements. The coupling capacitor (140) is coupled between the fifth node (N5) and a sixth node (N6), wherein the sixth node (N6) corresponds to an AC coupled output of the LC filter that includes a detected signal amplitude and a detected signal phase of the LC filter responsive to facial movements of the user.

Example Clause 11: The device of Clause 10, wherein the first FET and the second FET each comprise: an N-type FET, a P-type FET, or a combination of N-type and P-type FETs.

Example Clause 12: The device of Clause 10, wherein the logic block and gate drive block are arranged to provide non-overlapping switched operation of the first FET and the second FET, where the first FET and the second FET each comprise: an N-type FET, a P-type FET, or a combination of N-type and P-type FETs.

Example Clause 13: The device of Clause 13, the inductor circuit further comprising one of an inductor, a magnetically coupled pair of mutual inductors, and a cross-coupled pair of mutual inductors.

Example Clause 14: The device of any of Clauses 10 through 12, wherein the inductor circuit comprises a cross-coupled pair of mutual inductors with a first inductor and a second inductor, wherein the first inductor is coupled between the fourth node and an intermediate node with a polarity designated at the fourth node, and wherein the second inductor is coupled between the intermediate node and the fifth node with a polarity designated at the common node.

Example Clause 15: The device of and of Clauses 10 through 12, further comprising a first additional capacitor and a second additional capacitor. The first additional capacitor is coupled between the fifth node and low-side supply node. The second additional capacitor is coupled between the low-side supply node and an intermediate node. The inductor circuit further comprises a magnetically coupled pair of mutual inductors with a first inductor and a second inductor, where the first inductor is coupled between the fourth node and the fifth node with a polarity designated at the fifth node, and the second inductor is coupled between the fourth node and the intermediate node with a polarity designated at the intermediate node.

Example Clause 16: The device any of Clauses 10 through 15, further comprising a plurality of antennas, each positioned about different location of the wearable frame, each of the plurality of antennas having a characteristic capacitance that varies based on distance between the corresponding one of the plurality of antennas and skin of the user, wherein the capacitance value of the sense capacitor corresponds to the characteristic capacitance of one of the plurality of antennas.

Example Clause 17: The device of Clause 16, further comprising a multiplexer that is configured to selectively couple one of the plurality of antennas to the fifth node response to a control signal such that the characteristic capacitance of the selected one of the plurality of antennas corresponds to the capacitance value of the sense capacitor.

Example Clause 18: The device of any of Clauses 10 through 17, further comprising a voltage adjuster that receives the AC coupled output from the sixth node and generates a scaled AC output at a seventh node.

Example Clause 19: The device of Clause 18, wherein the voltage adjuster is configured to adjust one or more of: a DC offset for the scaled AC output, and a voltage magnitude adjustment for the scaled AC output.

Example Clause 20: The device of any of Clauses 18 and 19, the voltage adjuster comprising: a first resistor, a second resistor, and a third resistor, wherein the first resistor is coupled between the sixth node and the seventh node, the second resistor is coupled between a DC supply node and the seventh node, and the third resistor is coupled between the seventh node and the low-side supply.

It will be understood that the configurations and/or approaches described herein are exemplary in nature, and that these specific embodiments or examples are not to be considered in a limiting sense, because numerous variations are possible. The specific circuits, devices and systems described herein may represent one or more of any number of strategies. As such, various system and/or circuit components may be broken into additional functions or circuits, and/or combined with other functions or circuits as may be desirable in a specific implementation The subject matter of the present disclosure includes all novel and non-obvious combinations and sub-combinations of the various processes, circuits, devices, systems and configurations, and other features, functions and/or properties disclosed herein, as well as any and all equivalents thereof.

We claim:

1. A battery operated Mixed Reality (MR) device to sense facial movements of a user, the device comprising:
a pulse driver (110) that generates one or more pulse signals at a first node (N4) responsive to an input frequency signal (RFFT_FREQ), wherein the pulse driver (110) operates on a reduced voltage that is lower than the battery voltage;
an LC filter that includes:
an inductor circuit (120) that is coupled between the first node (N4) and a second node (N5);
a sense capacitor (130) that is coupled between the second node (N5) and a third node (N0), wherein a capacitance value of the sense capacitor (130) varies responsive to the facial movements of the user such that a characteristic resonance of the LC filter varies responsive to the facial movements; and
a coupling capacitor (140) that is coupled between the second node (N5) and a fourth node (N6), wherein the fourth node (N6) corresponds to an AC coupled output of the LC filter that includes a detected signal amplitude and a detected signal phase of the LC filter responsive to facial movements of the user.

2. The device of claim 1, further comprising a power converter that is configured to convert the battery voltage to the reduced voltage, wherein the power converter comprises one or more of a voltage divider circuit and a digital-to-analog converter circuit.

3. The device of claim 1, further comprising a voltage adjuster that receives the AC coupled output from the fourth node and generates a scaled AC output at a fifth node.

4. The device of claim 3, wherein the voltage adjuster is configured to adjust one or more of: a DC offset for the scaled AC output, and a voltage magnitude adjustment for the scaled AC output.

5. The device of claim 1, the inductor circuit further comprising one of an inductor, a magnetically coupled pair of mutual inductors, and a cross-coupled pair of mutual inductors.

6. A battery operated Mixed Reality (MR) device including a wearable frame that is configured to sense facial movements of a user, the device comprising:
a power converter (105) that receives the battery voltage from a first node (N1), and generates a reduced voltage at a second node (N2), wherein the reduced voltage is lower than the battery voltage;
a pulse driver (110) that receives the reduced voltage from the second node (N2), receives an input frequency signal (RFFT_FREQ) from a third node (N3), and generates one or more output pulses at a fourth node (N4), wherein the amplitude of the output pulses are below the reduced voltage, and wherein the frequency of the output pulses are determined by the input frequency signal (RFFT_FREQ);
an inductor circuit (120) that is coupled between the fourth node (N4) and a fifth node (N5), wherein the inductor circuit (120) has a characteristic inductance (Leq);
a plurality of antennas (170), each positioned about different location of the wearable frame, each of the plurality of antennas (170) having a characteristic sense capacitance ($C_S$) that varies based on distance between the corresponding one of the plurality of antennas (170) and skin of the user;
a multiplexer (160) that is configured to selectively couple one of the plurality of antennas (170) to a fifth node (N5) response to a control signal (ANT_SEL), wherein an LC filter is formed by the characteristic inductance (Leq) of the inductor circuit (120) and the characteristic sense capacitance ($C_S$) of the selected one of the plurality of antennas (170); and
a coupling capacitor (140) that is coupled between the fifth node (N5) and a sixth node (N6), wherein the sixth node (N6) corresponds to an AC coupled output of an LC filter that includes a detected signal amplitude and a detected signal phase of the LC filter responsive to facial movements of the user.

7. The device of claim 6, further comprising a voltage adjuster that receives the AC coupled output from the sixth node and generates a scaled AC output at a seventh node.

8. The device of claim 7, wherein the voltage adjuster is configured to adjust one or more of: a DC offset for the scaled AC output, and a voltage magnitude adjustment for the scaled AC output.

9. The device of claim 6, the inductor circuit further comprising one of an inductor, a magnetically coupled pair of mutual inductors, and a cross-coupled pair of mutual inductors.

10. A battery operated Mixed Reality (MR) device including a wearable frame that is configured to sense facial movements of a user, the device comprising:
a pulse driver (110) that receives a high-side supply voltage from a second node (N2), receives an input frequency signal (RFFT_FREQ) from a third node (N3), and generates one or more output pulses at a fourth node (N4), wherein the pulse driver (110) includes:
a logic block that generates a high side switch control signal (LPH) and a low side switch control signal (LPL) responsive to the input frequency signal (RFFT_FREQ) from the third node (N3);
a gate drive block that provides a first gate drive signal (GH) responsive to the high-side switch control signal (LPH), a second gate drive signal (GL) responsive to the low-side switch control signal (LPL);
a first FET that is selectively activated responsive to the first gate drive signal (GH) to couple the second node (N2) to the fourth node (N4); and
a second FET that is selectively activated responsive to the second gate drive signal (GL) to couple the fourth node (N4) to a low-side supply node (N0);
an inductor circuit (120) that is coupled between the fourth node (N4) and a fifth node (N5), wherein the inductor circuit has a characteristic inductance (Leff);
a sense capacitor (130) that is coupled between the fifth node (N5) and the low-side supply node (N0), wherein a capacitance value ($C_S$) of the sense capacitor varies responsive to the facial movements of the user such that a characteristic resonance of and LC filter formed by the inductor circuit (120) and the sense capacitor (130) varies responsive to the facial movements; and
a coupling capacitor (140) that is coupled between the fifth node (N5) and a sixth node (N6), wherein the sixth node (N6) corresponds to an AC coupled output of the LC filter that includes a detected signal amplitude and a detected signal phase of the LC filter responsive to facial movements of the user.

11. The device of claim 10, wherein the first FET and the second FET each comprise: an N-type FET, a P-type FET, or a combination of N-type and P-type FETs.

12. The device of claim 10, wherein the logic block and gate drive block are arranged to provide non-overlapping switched operation of the first FET and the second FET, where the first FET and the second FET each comprise: an N-type FET, a P-type FET, or a combination of N-type and P-type FETs.

13. The device of claim 10, the inductor circuit further comprising one of an inductor, magnetically coupled pair of mutual inductors, and a cross-coupled pair of mutual inductors.

14. The device of claim 10, wherein the inductor circuit comprises a cross-coupled pair of mutual inductors with a first inductor and a second inductor, wherein the first inductor is coupled between the fourth node and a common node with a polarity designated at the fourth node, and wherein the second inductor is coupled between the common node and the fifth node with a polarity designated at the common node.

15. The device of claim 10, further comprising: a first additional capacitor and a second additional capacitor, wherein:
the first additional capacitor is coupled between the fifth node and low-side supply node;
the second additional capacitor is coupled between the low-side supply node and an intermediate node; and
the inductor circuit further comprises a magnetically coupled pair of mutual inductors with a first inductor and a second inductor, where the first inductor is coupled between the fourth node and the fifth node with a polarity designated at the fifth node, and the second inductor is coupled between the fourth node and the intermediate node with a polarity designated at the intermediate node.

16. The device of claim 10, further comprising a plurality of antennas, each positioned about different location of the wearable frame, each of the plurality of antennas having a characteristic capacitance that varies based on distance between the corresponding one of the plurality of antennas and skin of the user, wherein the capacitance value of the sense capacitor corresponds to the characteristic capacitance of one of the plurality of antennas.

17. The device of claim 16, further comprising a multiplexer that is configured to selectively couple one of the plurality of antennas to the fifth node response to a control signal such that the characteristic capacitance of the selected one of the plurality of antennas corresponds to the capacitance value of the sense capacitor.

18. The device of claim 10, further comprising a voltage adjuster that receives the AC coupled output from the sixth node and generates a scaled AC output at a seventh node.

19. The device of claim 18, wherein the voltage adjuster is configured to adjust one or more of: a DC offset for the scaled AC output, and a voltage magnitude adjustment for the scaled AC output.

20. The device of claim 18, the voltage adjuster comprising: a first resistor, a second resistor, and a third resistor, wherein the first resistor is coupled between the sixth node and the seventh node, the second resistor is coupled between a DC supply node and the seventh node, and the third resistor is coupled between the seventh node and the low-side supply.

* * * * *